(12) United States Patent
Yu et al.

(10) Patent No.: US 8,492,054 B2
(45) Date of Patent: Jul. 23, 2013

(54) MECHANISMS FOR PATTERNING FINE FEATURES

(75) Inventors: Shinn-Sheng Yu, Hsinchu (TW); Anthony Yen, Jhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 179 days.

(21) Appl. No.: 13/072,169

(22) Filed: Mar. 25, 2011

(65) Prior Publication Data
US 2012/0244460 A1    Sep. 27, 2012

(51) Int. Cl.
*G03F 1/22* (2012.01)
*G03F 1/24* (2012.01)

(52) U.S. Cl.
USPC ............................................................ 430/5

(58) Field of Classification Search
USPC .................... 430/5, 30, 322, 323; 378/35
See application file for complete search history.

(56) References Cited

U.S. PATENT DOCUMENTS

| | | | |
|---|---|---|---|
| 2004/0131947 A1 | 7/2004 | Fisch et al. | |
| 2005/0287447 A1* | 12/2005 | Kamm et al. | 430/5 |
| 2007/0196744 A1* | 8/2007 | Hennig et al. | 430/5 |
| 2007/0292771 A1 | 12/2007 | Ke et al. | |
| 2008/0318138 A1 | 12/2008 | Holfeld | |
| 2011/0159410 A1 | 6/2011 | Lin et al. | |
| 2012/0045712 A1 | 2/2012 | Chang et al. | |

FOREIGN PATENT DOCUMENTS

CN    1695093    11/2005

OTHER PUBLICATIONS

Office Action dated Feb. 26, 2013 from corresponding application No. CN201110259735.3.

* cited by examiner

*Primary Examiner* — Stephen Rosasco
(74) *Attorney, Agent, or Firm* — Lowe Hauptman Ham & Berner, LLP

(57) ABSTRACT

The embodiments described provide mechanisms for patterning features for advanced technology nodes with extreme ultraviolet lithography (EUVL) tools. One or more EUV pre-masks are generated by using a mask writer to form an EUV mask with an EUV scanner. The wafers are then patterned by using the EUV mask. The demagnification factor of the EUV scanner(s) used in preparing the EUV mask by exposing the EUV pre-mask(s) enable the wafers prepared by such mechanisms to meet the requirements for the advanced technology nodes.

20 Claims, 7 Drawing Sheets

MECHANISMS FOR PATTERNING FINE FEATURES

FIELD OF THE INVENTION

The present disclosure relates generally to the field of lithography used in the fabrication of integrated circuit devices, and more particularly, to extreme ultraviolet light (EUV) lithography.

BACKGROUND

In the manufacture of integrated circuits (IC), or chips, patterns representing different layers of the chip are created on a series of reusable photomasks (also referred to herein as masks) in order to transfer the design of each chip layer onto a semiconductor substrate during the manufacturing process. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask employed in optical lithography generally comprises a transparent substrate having an opaque, light-absorbing layer disposed thereon. Conventional masks typically include a glass or quartz substrate having a layer of chromium on one side. The chromium layer is covered with an anti-reflective coating and a resist. During a patterning process, the circuit design is written onto the mask, for example, by exposing portions of the resist to an electron beam or ultraviolet light, thereby making the exposed portions soluble in a developing solution, if the resist is a positive-tone resist. The soluble portion of the resist is then removed, allowing the underlying chromium and anti-reflective layers to be etched (i.e., removed).

With the shrinking of critical dimensions (CD), present optical lithography is approaching a technological limit at the 28-nanometer (28-nm) technology node (or N28). Next generation lithography (NGL) is expected to replace the current optical lithography method, for example, in the 20-nm technology node (N20) and beyond. There are several NGL candidates. Of these NGL candidates, multiple electron beam direct writing (MEBDW), which is also referred to as multiple electron beam maskless lithography (MEBML2), and extreme ultraviolet lithography (EUVL) are leading candidates. Although it is claimed that MEBDW does not require a mask, MEBDW requires delineating 1× feature sizes directly on the substrates, which could be quite challenging for advanced technology nodes with very fine features. EUVL uses a much shorter wavelength, such as about 13.5 nm, which is about ⅒ the effective wavelength of ArF immersion lithography, to enhance resolution. The EUV exposure tools (EUV scanners) also utilize reduction projection printing as optical scanners and may achieve a reduction ratio of 4. As a result, EUVL is considered as a most promising candidate for NGL.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
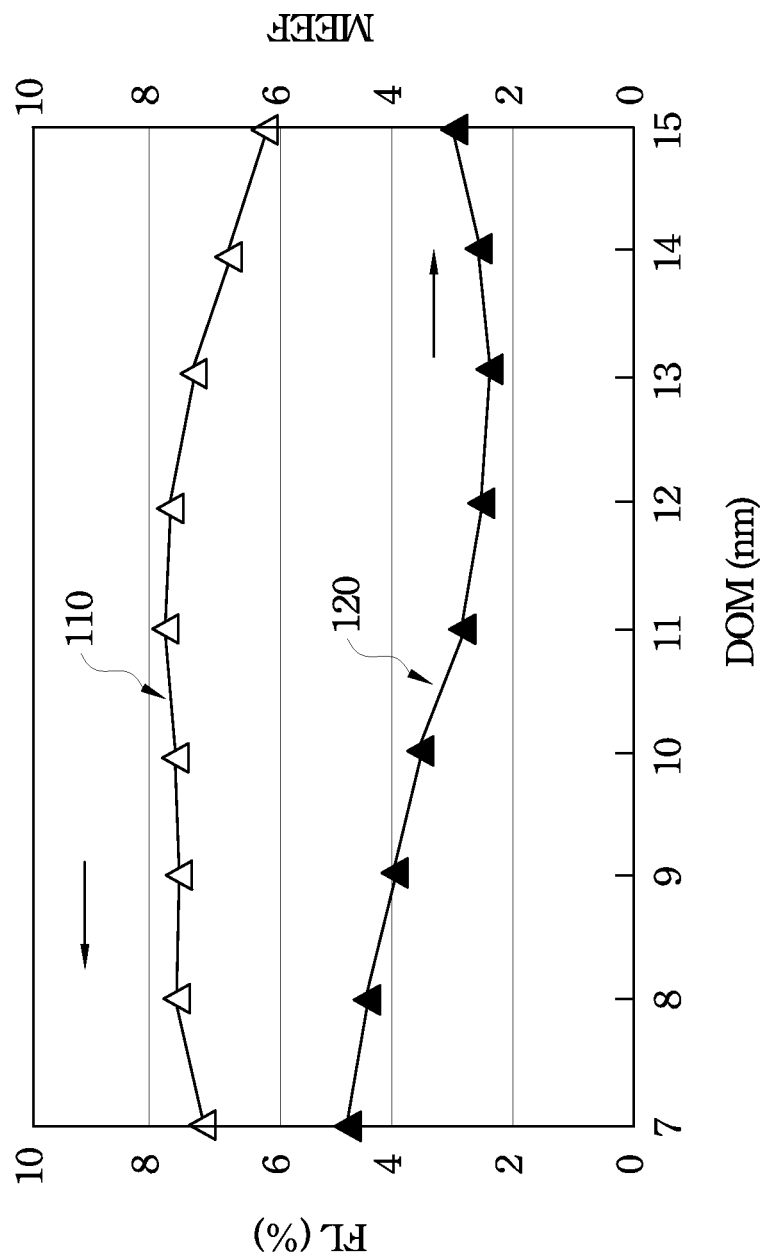
FIG. 1A shows simulation results of exposure latitude (EL) and mask error enhancement factor (MEEF) for N07 vertical lines with vertical scanning, in accordance with some embodiments.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In semiconductor manufacturing, one of the key limiters on how small device feature sizes can be realized is the capability of exposure tools for performing lithographic patterning. Exemplary state-of-the-art exposure tools, such as NXT: 1950i by ASML of Veldhoven, The Netherlands, and NSR-S620D by Nikon Inc. of Tokyo, Japan, could be used to produce devices meeting the design rules and process requirements of 28-nm technology node (or N28), which has a minimum pitch of about 90 nm. In the semiconductor industry, each generation node often achieves an about 70% reduction in critical dimension (CD), which is the minimum feature size. However, the design rules and/or process requirements for N20 (a technology beyond N28 with minimum pitch of about 64 nm) exceed the capability of the state-of-the-art exposure tools mentioned above. Although lithographic technologies using multiple exposure and/or multiple patterning can be used to delineate features of smaller pitches to extend the application of the state-of-the-art exposure tools, such applications could be very costly, which make them potentially unacceptable for production.

As mentioned above, EUVL is a likely successor for patterning of advanced technology nodes, such as 20-nm technology node (or N20) and beyond. Based on analysis of EUVL tool capability, EUVL would most likely work for the technology nodes, such as N20, N14, and possibly N10. N14 and N10 are two technology nodes beyond N20. The minimum pitch for N20 has been described above and the minimum pitches for N14, and N10 are about 44 nm, and 32 nm respectively. However, for N07 (7-nm technology node with a minimum pitch of about 22 nm), EUVL could encounter issues. FIG. 1A shows simulation results of exposure latitude (EL) and mask error enhancement factor (MEEF) for vertical lines with vertical scanning for N07 features, in accordance with some embodiments. The simulator used is HYPERLITH™ from Panoramic Technology Incorporated of Berkeley, Calif. However, other simulators, such as Sentaurus EUV from Synopsys Incorporated of Mountain View, Calif. and PROLITH™ from KLA-Tencor Corporation of Milpitas, Calif., may also be used.

The results show a curve 110 of exposure latitude (EL) versus dimension on mask (DOM), which represents the dimensions of features on the mask to achieve a given target of dimension on wafer (DOW) of 11 nm, which is about half the minimum pitch. The exposure latitude (EL) is the extent to which a light-sensitive material can be overexposed or underexposed and still achieves an acceptable DOW (or DOW within specification). FIG. 1A shows that the simulated EL is in a range from about 6% to about 8%. EL indicates the budget for exposure-dose-related process variations. If EL is larger, the allowable exposure-dose-related process variations are larger. Since EUV scanners for high volume manufacturing are not available now, their performance is estimated by the performance of the current state-of-the-art exposure tools. For example, ASML NXT:1950i and Nikon NSR-S620D are both state-of-the art exposure tools for 193-nm (deep ultraviolet DUV) water immersion lithography. The dose controllability, including exposure slit intensity uniformity and exposure dose repeatability, achieved by such tools is within about 1%. Assuming the EUV scanners for high volume manufacturing can achieve the same performance as the state-of-the art DUV exposure tools, they should be able to meet the specification, since the simulated EL indicates an ample process budget (6%-8% as indicated above).

FIG. 1A also shows a curve 120 of mask error enhancement factor (MEEF) for DOM in a range from about 7 nm to about 15 nm. Curve 120 shows that the MEEFs are from about 2 to about 5. MEEF reflects the extent that an error of a mask CD is magnified in a corresponding wafer CD. For a specific feature using a specific lithographic process, the allowable mask error for the specific feature is smaller if the MEEF is larger. MEEF can be represented by equation (1) below.

$$MEEF = \Delta CD_{wafer}/(\Delta CD_{mask}/M) \quad (1)$$

M is the demagnification factor (or reduction ratio), which is 4 for current scanners. $\Delta CD_{mask}$ is the CD error of a feature on a mask and $\Delta CD_{wafer}$ is the CD error of the feature patterned on a wafer. MEEF may be affected by the illumination and projection settings of the scanner, and the tool and process variations of the scanner, which could impact aerial image contrast. MEEF may also be affected by the resist and resist process used, and the specific features patterned. As mentioned above, the CD of N07 features can be assumed to be roughly half of the pitch of about 22 nm, which is about 11 nm. The tolerance of $CD_{wafer}$ (or $\Delta CD_{wafer}$) can be assumed to be about ±10% of the feature size, which is about 11 nm. Therefore, the $\Delta CD_{wafer}$ is about ±1 nm (10% of 11 nm). If the MEEF is 2, the allowable $\Delta CD_{mask}$ is about ±2 nm, according to equation (1) with the $\Delta CD_{wafer}$ being about ±1 nm. Current mask writers can meet the requirement of about ±2 nm for $\Delta CD_{mask}$.

Figure 1B:
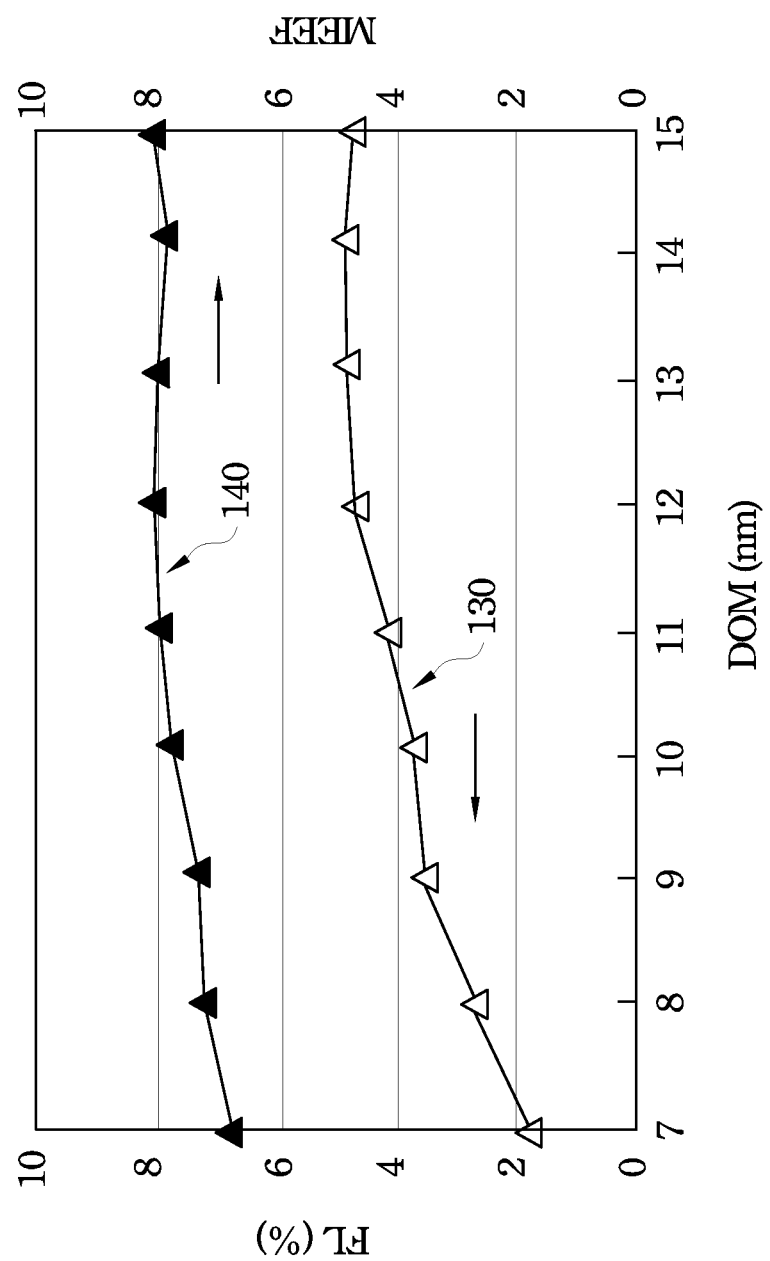
FIG. 1B shows simulation results of exposure latitude (EL) and mask error enhancement factor (MEEF) for N07 horizontal lines with vertical scanning, in accordance with some embodiments.

FIG. 1B shows simulation results of exposure latitude (EL) and mask error enhancement factor (MEEF) for N07 horizontal lines with vertical scanning, in accordance with some embodiments. The results show that the EL (curve 130) values are between from 2% to about 5%, which should also be achievable by the EUV scanners for high volume manufacturing. The results further show that the MEEF values (curve 140) are in a range from about 7 to about 8, which are unacceptably high. Based on the simulation results above, using an electron beam mask writer to prepare masks (or reticles) for EUVL would not work for N07 due to the MEEF being too high for horizontal lines. However, with the knowledge learned from EUVL for N20, N14 or N10, it would be desirable to continue using EUVL for N07. Therefore, it's highly desirable to seek solutions to make EUVL possible for N07.

Figure 1C:
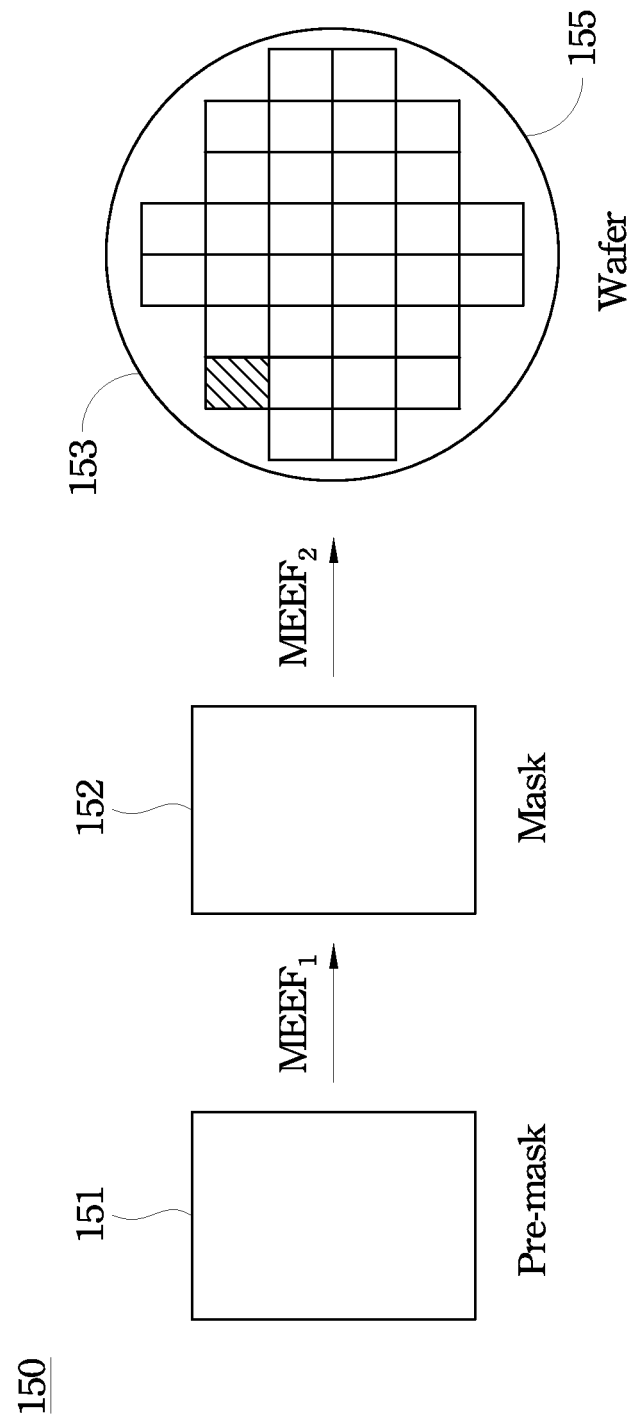
FIG. 1C shows a processing sequence (or flow) of EUVL, in accordance with some embodiments.

As mentioned above, scanners enable a 4× reduction projection printing and provide a demagnification factor of 4. If the mask for N07 is printed by an EUV scanner, not an electron beam mask writer, the $\Delta CD_{mask}$ can be greatly reduced. FIG. 1C shows a processing sequence (or flow) 150 of mask making by EUVL, in accordance with some embodiments. In process sequence (or flow) 150, a pre-mask 151 is first made by using an electron beam writer. The pre-mask 151 is then used to pattern a mask 152 by EUVL for the eventual patterning of wafer 155. An EUV scanner can be used to reduce (4× reduction in linear dimension) the patterns on the pre-mask 151 on the mask 152. The patterns on mask 152 are then reduced on the same or different EUV scanner to create patterns 153 of a semiconductor chip on wafer 155. Due to the 4× reduction of EUV scanners, the sizes of patterns on the EUV pre-mask 151 are 4× the sizes on the EUV mask 152. For advancement of each technology node of semiconductor manufacturing, a 70% (or ~1/√2) shrinkage of sizes is targeted and has been achieved. A 4× enlargement of dimensions equates to 4 generations of technology nodes backward. Therefore, pre-mask 151 could be created by using an electron beam writer with N28 mask technology, which is currently ready and used in production.

FIG. 1C shows that there is a $MEEF_1$ when pre-mask 151 is used to form mask 152 and a $MEEF_2$ when mask 152 is used to form pattern 153, due to the usage of EUV scanner(s). The overall MEEF for the entire patterning process is shown below in equation (2).

$$MEEF = MEEF_1 \times MEEF_2 \quad (2)$$

$MEEF_1$ and $MEEF_2$ are defined in equations (3) and (4), respectively.

$$MEEF_1 = \Delta CD_{mask}/(\Delta CD_{pre-mask}/M_1) \quad (3)$$

$$MEEF_2 = \Delta CD_{wafer}/(\Delta CD_{mask}/M_2) \quad (4)$$

$M_1$ is the demagnification factor (or reduction ratio) of the scanner used to pattern mask 152 by using pre-mask 151. $M_2$ is the demagnification factor of the scanner used to pattern wafer 155 by using mask 152. The simulation results shown in FIGS. 1A and 1B show that the MEEF for N07 EUVL is in a range from about 2 to about 8, which is $MEEF_2$ of FIG. 1C. The $MEEF_1$ of FIG. 1C and equation (2) is very low and close to 0, since the pre-mask is made by an electron beam writer for N28 technology node and the mask is made by an EUV scanner (with 4× reduction). As a result, the total MEEF of equation (2) ($MEEF_1 \times MEEF_2$) is also very low. In some embodiments, the total MEEF is equal to or less than about 2.

Therefore, the $\Delta CD_{wafer}$ using the process sequence 150 described above can meet the N07 tolerance requirement of about ±1 nm.

Figure 2:
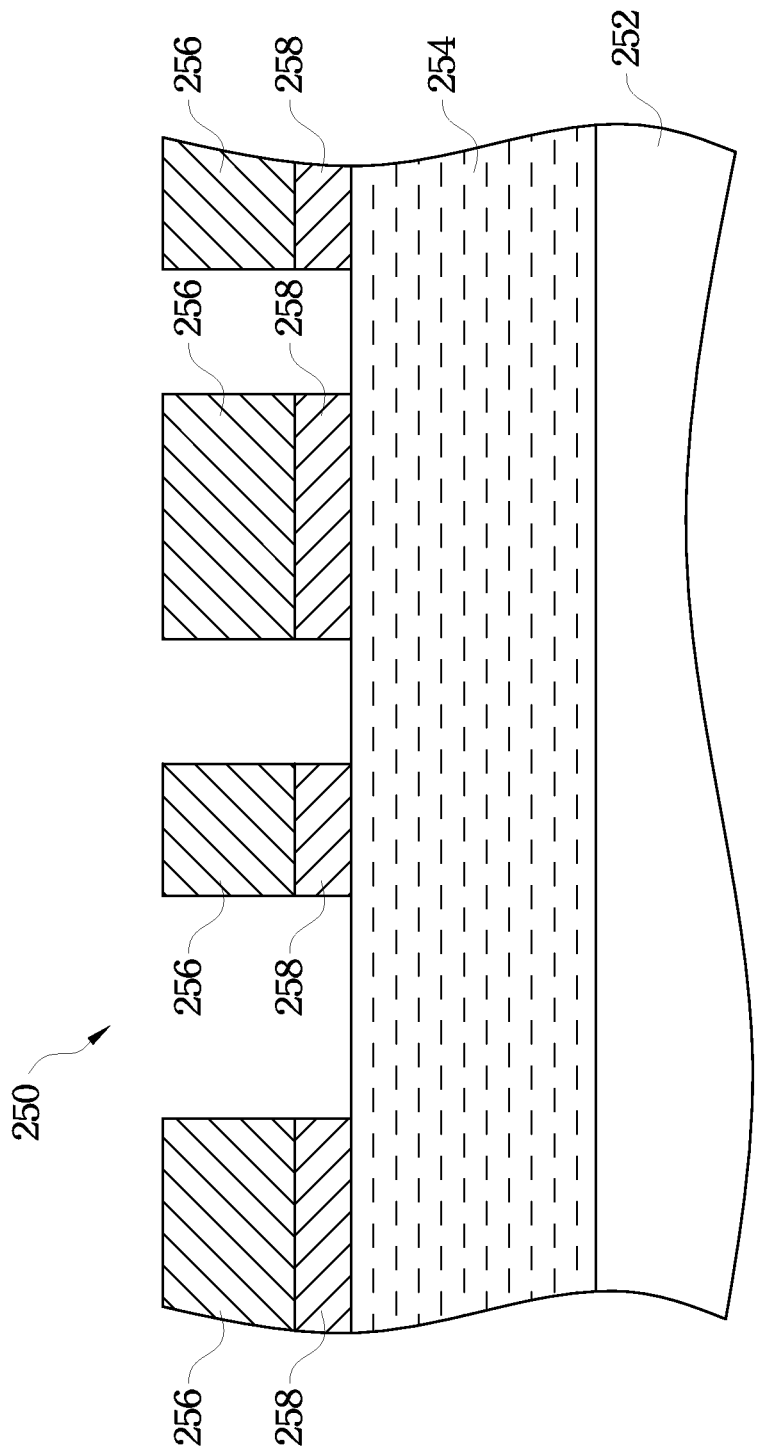
FIG. 2 is a schematic cross-sectional view illustrating an EUV mask, in accordance with some embodiments.

FIG. 2 illustrates an EUV blank mask 250, in accordance with some embodiments. The EUV mask 250 can be a pre-mask 151 or a mask 152 described above. The substrate 252 of the EUV mask 250 may be any size suitable for use as a mask. In some embodiments, the substrate 252 has a rectangular shape with sides in a range from about 5 inches to about 9 inches in length. The substrate 252 may have a thickness in a range from about 0.15 inches to about 0.25 inches, in some embodiments. In some other embodiments, the substrate 252 is about 0.25 inches thick.

In some embodiments, the substrate 252 is made of a low thermal expansion material (LTEM) layer (e.g., $TiO_2$-doped $SiO_2$) and a reflective multilayer (ML) coating 254 deposited over the LTEM layer. The reflective ML coating 254 (also referred to as a mirror, or EUV reflective layer) comprises a number of alternating materials with different refractive indices and extinction coefficients. In some embodiments, the reflective ML coating 254 includes alternating molybdenum (Mo) and silicon (Si) layers in a range from about 30 pairs to about 60 pairs. Each pair of the Mo and Si layers may comprise a Mo layer with a thickness of about 3 nm and a Si layer with a thickness of about 4 nm. The reflective ML coating 254 may have an EUV light reflectivity of up to 67% at 13.5 nm wavelength.

An absorber layer 256 (such as a TaN material layer) is deposited over the reflective ML coating 254. A buffer layer 258 (e.g., a silicon dioxide layer) may be deposited between the reflective ML coating 254 and the absorber layer 256 to protect the ML coating during the patterning process. A capping layer (not shown) may also be deposited over the reflective ML coating 254 to protect the reflective ML coating 254. In some embodiments, the buffer layer 258 may act as a combined buffer layer and capping layer between the reflective ML coating 254 and the absorber layer 256. In some embodiments, the buffer layer 258 is a silicon (Si) layer. The buffer layer 258, for example, may have a thickness ranging from about 2 nm to about 20 nm, in some embodiments.

A desired pattern for the EUV mask is defined by selectively removing portions of the absorber layer 256 (and buffer layer 258) to uncover portions of the underlying ML coating 254 on the substrate 252, providing a patterned EUV mask as illustrated in FIG. 2. The absorber layer 256 may be selectively removed by a combination of patterning (e.g., laser-beam writing, electron-beam writing, or EUVL) and etching (e.g., wet and/or dry etching) processes.

In some embodiments, the absorber layer 256 comprises tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN). In some other embodiments, the absorber layer 256 comprises tantalum- and oxygen-based materials, such as oxidized and nitrogenized tantalum and silicon-based materials (hereinafter TaSiON), tantalum boron oxide-based materials (hereinafter TaBO), and oxidized and nitrogenized tantalum-based materials (hereinafter TaON).

Additional information related to creating mask 250 is described in U.S. patent application Ser. No. 12/650,985, filed on Dec. 31, 2009 and entitled "Cost-Effective Method for Extreme Ultraviolet (EUV) Mask Production," and U.S. patent application Ser. No. 12/858,159, filed on Aug. 17, 2010 and entitled "Extreme Ultraviolet Light (EUV) Photomasks, and Fabrication Methods Thereof," both of which are incorporated herein by reference in their entireties.

The EUV masks, such as mask 250, described above may be used as pre-mask 151 or a mask 152 described in FIG. 1C. If the EUV mask is used as a pre-mask (such as pre-mask 151), electron beam or laser beam writing technology for N28 can be used to define the pattern. If the EUV mask is used as a regular mask (such as mask 152) for wafer patterning, an EUV scanner is used to transfer the pattern on the pre-mask (such as pre-mask 151) to the regular mask (such as mask 152).

Figure 3:
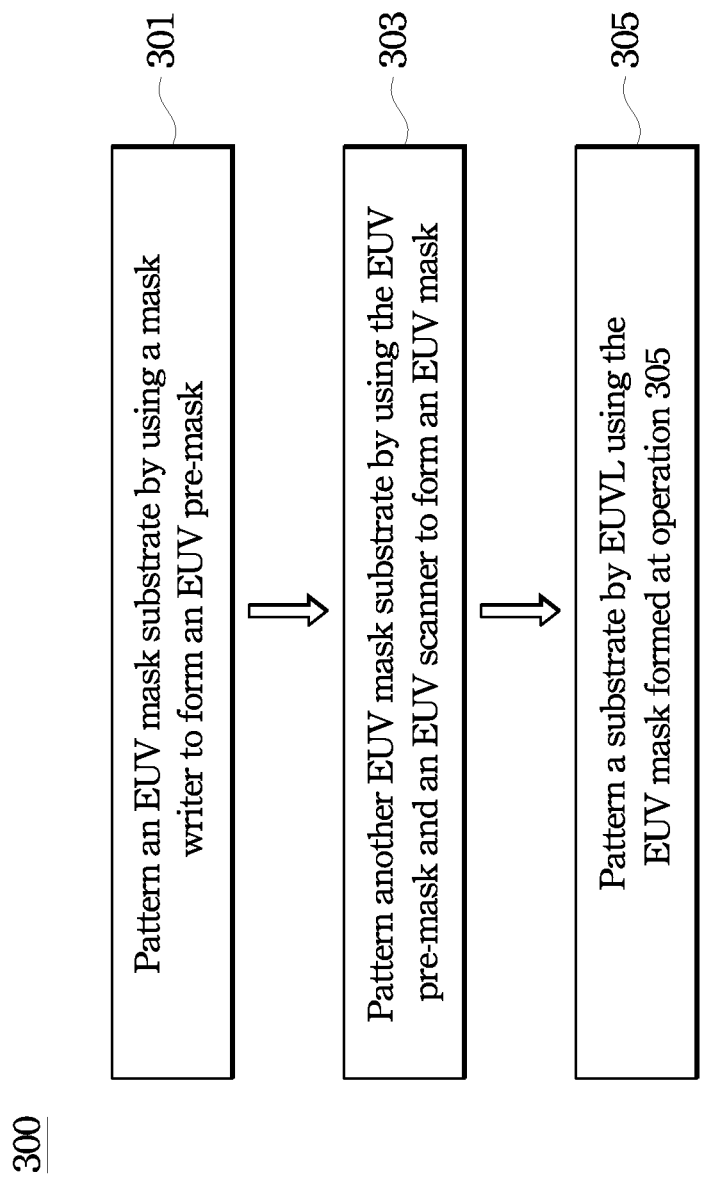
FIG. 3 shows a process flow of patterning a substrate with fine features, in accordance with some embodiments.

FIG. 3 shows a process flow 300 of patterning a substrate with fine features, such as features for advanced technology nodes, such as N14, N10, N7, and/or N05, in accordance with some embodiments. At operation 301, an EUV mask substrate with a resist layer is patterned by a mask writer, such as an electron beam or a laser writer. The EUV mask substrate has various layers under the resist layer, in some embodiments. As described above, the various layers may include an absorber layer, a buffer layer, which may also act as a capping layer, and an EUV reflective layer (or multilayer). After the EUV mask substrate is exposed and developed (or patterned), the substrate may undergo additional processing, such as etching and cleaning, to complete the EUV pre-mask making.

At operation 303, another EUV mask substrate with another resist layer is patterned by using an EUV scanner with the EUV pre-mask prepared at operation 301. This EUV mask substrate has various layers under the photoresist layer, in some embodiments. The various layers may also include an absorber layer, a buffer layer, which may also acts as a capping layer, and an EUV reflective layer (or multilayer), as described above. After the EUV mask substrate is exposed and developed (or patterned), the substrate may undergo additional processing, such as etching and cleaning to complete the mask making.

After the mask is formed at operation 303, a wafer (or a substrate) may be patterned by an EUV scanner using the mask formed at a following operation 305. The patterns can be formed on the wafer (with a resist layer) by placing the wafer in an EUV scanner and exposing the substrate by using the mask generated at operation 303. As mentioned above, the 4× reduction of the EUV scanners enables the $\Delta CD_{wafer}$ to be within acceptable range for technology nodes starting from N14, which include N14, N10, N07, N05, etc.

The 4× image reduction of EUV scanners provides great benefit for CD control of EUV masks, such as mask 152 of FIG. 1C. The CD of features on an EUV mask is 4× (4 times) the CD of corresponding patterned features on a wafer. It is relatively straightforward to use an EUV scanner, which is normally used to pattern a wafer, to pattern an EUV mask. For example, for an N07 wafer, the CD on the EUV mask would be about 44 nm (4 times 11 nm). Although an EUV pre-mask is needed to pattern the EUV mask, the CDs of features on the pre-mask is 4× the CDs of the corresponding patterned features on the EUV mask (or 16× the CDs of the corresponding patterned features on the wafer). It is relatively straightforward to use a current electron beam mask writer to pattern an EUV pre-mask with a CD which is 16× (16 times) the CD on a wafer, such as 11 nm for an N07 wafer.

However, the 4× image reduction of EUV scanners also raises some concerns. If the current mask infrastructure and the imaging systems of the EUV scanners are not changed, the largest achievable linear chip dimension is ¼ of the field size of the EUV scanner. An exemplary field size of an EUV scanner is about 26 mm×33 mm. If the dimension of a chip is smaller than ¼ the field size of the EUV scanner, the field area of the pre-mask can fully accommodate all patterns of the chip. The EUV scanner may duplicate as many copies of the full chip patterns as possible on the field area of the EUV mask to maximize the patterning efficiency for the wafer. This can be achieved fairly easily by the EUV scanner.

Figure 4:
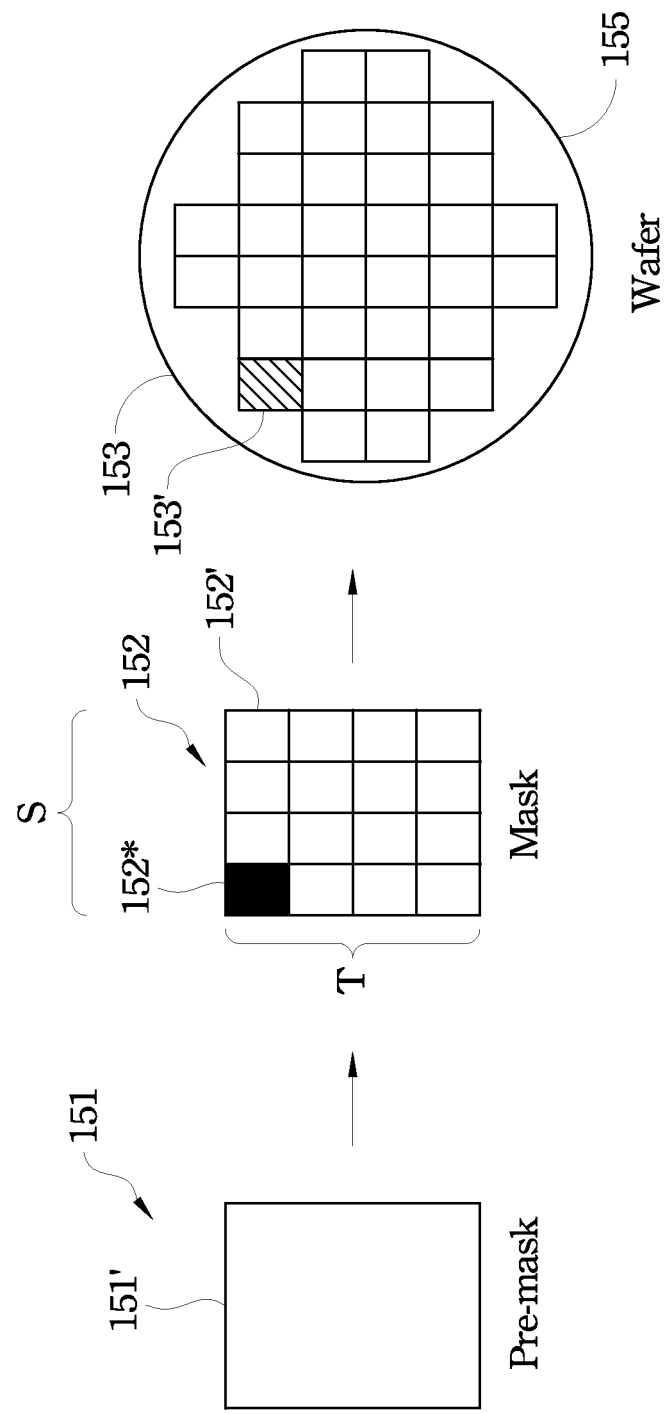
FIG. 4 shows a processing sequence of patterning substrate, in accordance with some embodiments.

FIG. 4 shows a processing sequence of patterning a substrate, in accordance with some embodiments. The pre-mask 151 has a pattern 151'. Pattern 152* is printed on mask 152 with pattern 151' being reduced (4× reduction in a linear dimension) to pattern 152*. On mask 152, the pattern 152* is repeated a number of times to form an overall pattern 152'. The repeated pattern 152* on mask 152 allows scanning of multiple copies of pattern 152* in each scanning operation to reduce processing time of patterning the wafer 155. The pattern 152* can be repeated S times horizontally and T times vertically. S and T can be any integer number from 1 to 4, in accordance with some embodiments. S and T can be any integer number from 1 to 10, in accordance with some other embodiments.

The 152* pattern may be repeated to fill the mask 152. In some embodiments, the total number of repeated 152* patterns is in a range from 1 to 16. In some other embodiments, the total number of repeated 152* patterns is in a range from 1 to 100. After the mask 152 is made, the patterns on mask 152 are transferred to substrate 155 by using an EUV scanner. FIG. 4 shows the pattern 152' on mask 152 is reduced (4× reduction in a linear dimension) to pattern 153 on substrate 155. The 152* pattern is reduced to pattern 153'. By making mask 152 to include a number of repeating patterns, the amount of time it takes to perform scanning exposure can be reduced to keep the processing cost down.

If the chip size is larger than ¼ the field size of the EUV scanner, the field area of the pre-mask cannot fully accommodate all patterns of the chip. As a result, more than one pre-mask is needed. Each pre-mask consists of a portion of patterns of the chip and multiple pre-masks are put together to compose the whole chip patterns.

Figure 5:
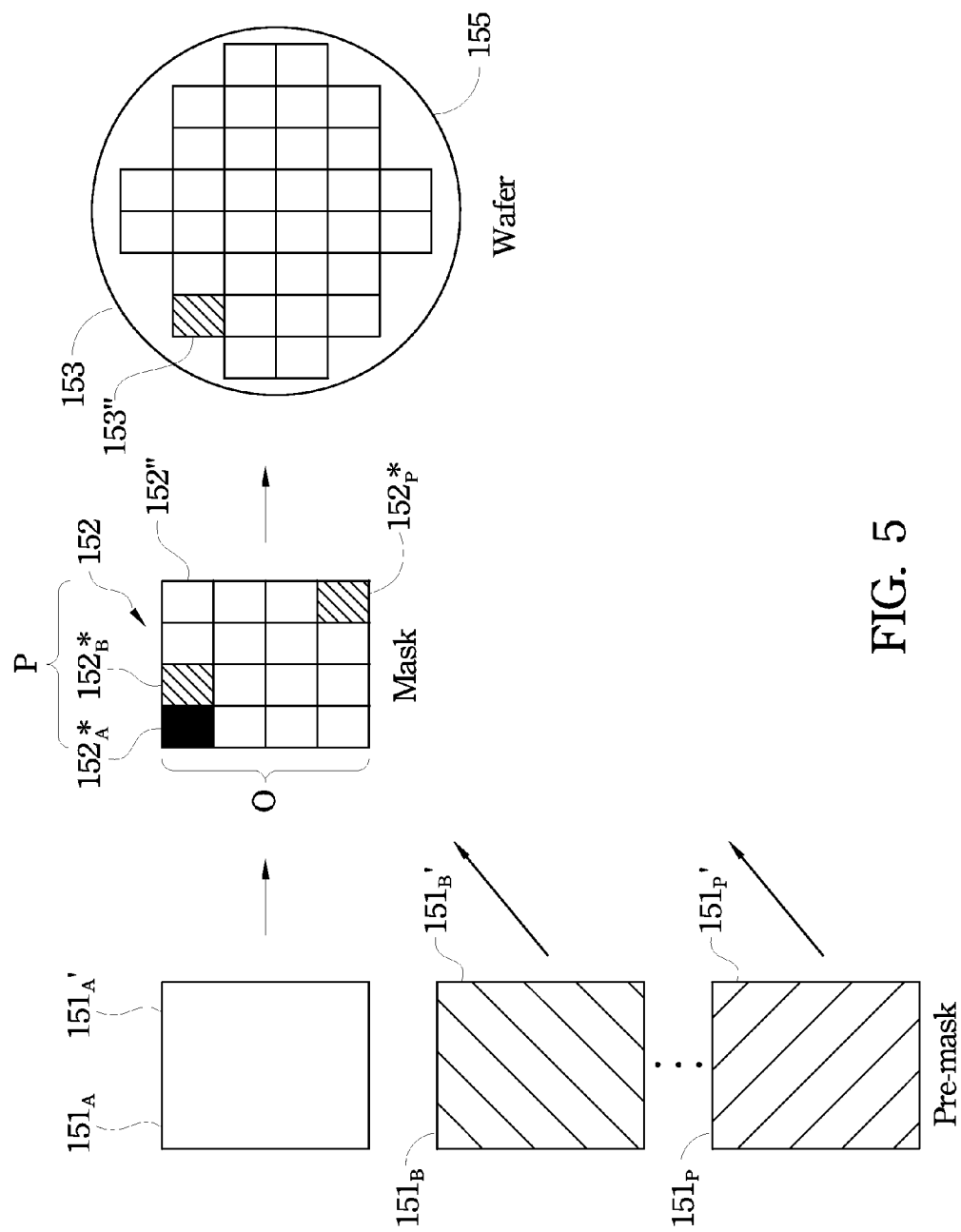
FIG. 5 shows another processing sequence of patterning substrate, in accordance with some embodiments.

FIG. 5 shows a processing sequence of patterning a substrate, in accordance with some embodiments. A number of pre-masks, $151_A$, $151_B$, ... $151_P$, have patterns $151_A'$, $151_B'$, ... $151_P'$ respectively. The number of pre-masks, $151_A$, $151_B$, ... $151_P$, can vary from 1 to 16. Patterns $151_A'$, $151_B'$, ... $151_P'$ are parts of a larger pattern. They can be put together on the mask 152. FIG. 5 shows that Patterns $151_A'$, $151_B'$, ... $151_P'$ are patterned (or exposed) on mask 152 sequentially to form a pattern 152". The sizes of patterns $151_A'$, $151_B'$, ... $151_P'$ are reduced (4× reduction in a linear dimension) to pattern $152_A^*$, $152_B^*$, ..., $152_P^*$ on mask 152. The difference between the pattern 152" of FIG. 5 and the pattern 152' of FIG. 4 is that the sub-patterns $152_A^*$, $152_B^*$, ..., $152_P^*$ of FIG. 5 are all different. These sub-patterns $152_A^*$, $152_B^*$, ..., $152_P^*$ form the overall pattern 152".

The pattern 152" may include O rows and P columns of sub-patterns. O and P can be any integer number from 1 to 4, in accordance with some embodiments. In some other embodiments, O and P can be any integer number from 1 to 10. After the mask 152 is made, the pattern 152" (including sub-patterns $152_A^*$ $152_B^*$, ..., $152_P^*$) on mask 152 are transferred to substrate 155 by using an EUV scanner. FIG. 5 shows the pattern 152" is transferred to substrate 155 and becomes pattern 153", which has the size of a regular chip. With proper alignment during the making of mask 152, the process sequence shown in FIG. 5 can produce a chip (with pattern 153") of regular size.

The embodiments of mechanisms for patterning fine features for advanced N07 technology node are described above. The mechanisms may also apply to other advanced technology nodes, such as N20, N14, N10, and even N05 (5-nm technology node with a minimum pitch of about 16 nm). The pieces of equipment needed to prepare pre-masks are the pieces of equipment used for the current N28 technology node. Using the current electron beam mask writer, e.g., EBM-7500 made by NuFlare Technology Inc. of Kanagawa, Japan, to prepare EUV pre-masks and the current EUV scanner, e.g., ASML NXE:3100, to prepare N07 masks remove the concerns of uncertainty of the readiness of advanced mask writers for the N07 technology node. When the N07 node arrives in a few years, the current electron beam mask writer and EUV scanners will be fully depreciated, which may also greatly reduce the production cost of N07 masks.

The embodiments described provide mechanisms for patterning features for advanced technology nodes with extreme ultraviolet lithography (EUVL) tools. One or more EUV pre-masks are generated by using a mask writer to form an EUV mask with an EUV scanner. The wafers are then patterned by using the EUV mask. The demagnification factor (4) of the EUV scanner(s) used in preparing the EUV mask by exposing the EUV pre-mask(s) enable the wafers prepared by such mechanisms to meet the requirements for the advanced technology nodes. In some embodiments, the EUV mask has a number of copies of the pattern on the EUV pre-mask to reduce the scanning time during wafer patterning. In some other embodiments, a number of pre-masks with different patterns are prepared to make a mask with an overall pattern. In addition, in some embodiments, the patterned wafers (or substrates) have CD variations equal to or less than about 2 nm. In some embodiments, the wafers are patterned with a minimal CD in a range from about 7 nm to about 17 nm.

In one embodiment, a method of fabricating an extreme ultraviolet (EUV) mask to pattern semiconductor substrates is provided. The method includes patterning a first EUV mask substrate by using a mask writer to form an EUV pre-mask, and patterning a second EUV mask substrate by using the EUV pre-mask in an EUV scanner to form the EUV mask. The EUV mask is used to pattern semiconductor substrates.

In another embodiment, a method of patterning a substrate is provided. The method includes patterning a first EUV mask substrate by using a mask writer to form an EUV pre-mask, and patterning a second EUV mask substrate by using the EUV pre-mask in an EUV scanner to form an EUV mask. The method also includes patterning the substrate by using the EUV mask, and the substrate is patterned with a minimal critical dimension (CD) in a range from about 7 nm to about 17 nm and a CD variation equal to or less than about 2 nm.

In yet another embodiment, an EUV mask is provided. The EUV mask includes a substrate, a reflective multilayer coating over the substrate, and an absorber layer over the reflective layer. The absorber layer is patterned by an EUV scanner by using an EUV pre-mask to expose a resist coating over the absorber layer, and wherein patterns formed on the EUV mask include a plurality of copies of patterns on the EUV pre-mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an extreme ultraviolet (EUV) mask to pattern semiconductor substrates, comprising:

patterning a first EUV mask substrate by using a mask writer to form an EUV pre-mask; and patterning a second EUV mask substrate by using the EUV pre-mask in an EUV scanner to form the EUV mask, wherein the EUV mask is used to pattern semiconductor substrates, and an overall mask error enhancement factor (MEEF) for the patterned semiconductor substrates is equal to or less than about 2.

2. The method of claim 1, wherein the forming of the EUV mask includes scanning patterns on the EUV pre-mask onto the EUV mask more than one time.

3. The method of claim 1, wherein the patterns on the EUV pre-mask are repeated on the EUV mask 1 to 100 times.

4. The method of claim 1, wherein more than one EUV pre-masks are formed, wherein each of the more than one EUV pre-masks is different from the others; and wherein each of the more than one EUV pre-masks is used to form the EUV mask.

5. The method of claim 4, wherein number of the more than one EUV pre-masks is from 1 to 100.

6. The method of claim 1, wherein the first or the second EUV mask substrate includes a substrate made of a low thermal expansion material, a reflective multilayer coating, a capping layer, a buffer layer, and an absorber layer.

7. The method of claim 1, wherein the mask writer is an electron beam writer.

8. The method of claim 1, wherein the patterned substrates have critical dimensions (CD) variations equal to or less than about 2 nm.

9. The method of claim 1, wherein the semiconductor substrates are patterned with a minimal critical dimension (CD) in a range from about 7 nm to about 17 nm.

10. A method of patterning a substrate, comprising:

patterning a first EUV mask substrate by using a mask writer to form an EUV pre-mask;

patterning a second EUV mask substrate by using the EUV pre-mask in an EUV scanner to form an EUV mask; and patterning the substrate by using the EUV mask, wherein the substrate is patterned with a minimal critical dimension (CD) in a range from about 7 nm to about 17 nm and a CD variation equal to or less than about 2 nm.

11. The method of claim 10, wherein overall mask error enhancement factor (MEEF) for patterning the substrate by using the EUV pre-mask and the EUV mask is equal to or less than about 2 nm.

12. The method of claim 10, wherein the forming of the EUV mask includes scanning patterns on the EUV pre-mask onto the EUV mask more than one time.

13. The method of claim 10, wherein the pattern on the EUV pre-mask is repeated on the EUV mask 1 to 100 times.

14. The method of claim 10, wherein more than one EUV pre-masks are formed, wherein each of the more than one EUV pre-masks is different from the others; and wherein each of the more than one EUV pre-masks is used to form the EUV mask, and wherein the number of the more than one EUV pre-masks is from 1 to 100.

15. An EUV mask, comprising:

a substrate;

a reflective multilayer coating over the substrate; and an absorber layer over the reflective layer, wherein the absorber layer comprises tantalum and at least one of oxygen, silicon or boron, and the absorber layer is configured to be patterned by an EUV scanner by using an EUV pre-mask to expose a resist coating over the absorber layer, and wherein patterns formed on the EUV mask include a plurality of copies of patterns on the EUV pre-mask.

16. The EUV mask of claim 15, further comprising a buffer layer, wherein the buffer layer is between the reflective multilayer coating and the absorber layer, and wherein the buffer layer also acts as a capping layer.

17. The EUV mask of claim 15, wherein the number of the plurality of copies of patterns is in a range from about 1 to about 16.

18. The EUV mask of claim 15, wherein the reflective multilayer coating is made of alternating layers of molybdenum (Mo) and silicon (Si), and wherein the number of alternating layers is in a range from about 30 pairs to about 60 pairs.

19. The EUV mask of claim 15, wherein the patterns formed on the EUV mask has a first critical dimension (CD) in a range from 4 times of about 7 nm to 4 times of about 17 nm, and wherein the EUV mask is used to pattern a substrate with a second CD in a range from about 7 nm to about 17 nm.

20. The EUV mask of claim 15, wherein the reflective multilayer coating comprises layers of molybdenum and layers of silicon arranged in an alternating fashion, wherein each of the layers of molybdenum has a thickness of about 3 nanometers (nm), and each of the layers of silicon has a thickness of about 4 nm.

* * * * *